(12) United States Patent
He

(10) Patent No.: US 11,785,741 B2
(45) Date of Patent: Oct. 10, 2023

(54) SYSTEM AND METHOD FOR COOLING A COMPUTING DEVICE

(71) Applicant: Dell Products L.P., Round Rock, TX (US)

(72) Inventor: Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 45 days.

(21) Appl. No.: 17/380,314

(22) Filed: Jul. 20, 2021

(65) Prior Publication Data

US 2023/0023542 A1    Jan. 26, 2023

(51) Int. Cl.
*H05K 7/20* (2006.01)
*G06F 1/20* (2006.01)

(52) U.S. Cl.
CPC .......... *H05K 7/20254* (2013.01); *G06F 1/20* (2013.01); *H05K 7/202* (2013.01); *H05K 7/20136* (2013.01)

(58) Field of Classification Search
CPC .......... H05K 7/20254; H05K 7/20136; H05K 7/202; G06F 1/20
See application file for complete search history.

(56) References Cited

U.S. PATENT DOCUMENTS

| | | | |
|---|---|---|---|
| 7,280,358 B2* | 10/2007 | Malone | H05K 7/20772 174/15.1 |
| 10,455,727 B1* | 10/2019 | Mikjaniec | H05K 7/20136 |
| 11,291,143 B2* | 3/2022 | Gao | H05K 7/20754 |
| 2004/0085732 A1* | 5/2004 | Cox | G06F 1/206 361/696 |
| 2006/0227504 A1* | 10/2006 | Chen | H05K 7/20909 361/679.52 |
| 2008/0259566 A1* | 10/2008 | Fried | H05K 7/20809 165/80.4 |
| 2011/0303394 A1* | 12/2011 | Branton | H05K 7/20763 165/104.33 |
| 2013/0317785 A1* | 11/2013 | Chainer | H05K 7/2079 703/1 |
| 2015/0003009 A1* | 1/2015 | Moore | H05K 7/20754 361/679.54 |
| 2018/0288903 A1* | 10/2018 | Chainer | G05D 23/1919 |
| 2019/0230816 A1* | 7/2019 | Chainer | H05K 7/20327 |
| 2021/0100137 A1* | 4/2021 | Harrington | H05K 7/20781 |
| 2022/0408606 A1* | 12/2022 | Gao | H05K 7/20763 |

* cited by examiner

*Primary Examiner* — Stephen S Sul
(74) *Attorney, Agent, or Firm* — Chamberlain, Hrdlicka, White, Williams & Aughtry

(57) ABSTRACT

A cooling system for use with a liquid to cool a computing device. The cooling system includes a first internal heat exchanger positioned within an enclosure of the computing device. The first internal heat exchanger is configured to receive a first portion of the liquid, flow the first portion through the first internal heat exchanger to dissipate heat from air flowing over the first internal heat exchanger, and discharge the first portion. The cooling system further includes a first fan operable to recirculate air through the enclosure to absorb heat produced by a plurality of components of the computing device and flow the heated air over the first internal heat exchanger to dissipate the heat.

17 Claims, 6 Drawing Sheets

SYSTEM AND METHOD FOR COOLING A COMPUTING DEVICE

BACKGROUND

Computing devices, such as computing devices may perform services. To provide the services, the computing devices may include hardware components and software components. The software components may utilize the hardware components to provide the services. The hardware, when utilized, generates heat that must be dissipated to prevent damage to the hardware.

SUMMARY

In one aspect, a cooling system for use with a liquid to cool a computing device. The cooling system includes a first internal heat exchanger and positioned within an enclosure of the computing device. The first internal heat exchanger is configured to receive a first portion of the liquid, flow the first portion through the first internal heat exchanger to dissipate heat from air flowing over the first internal heat exchanger, and discharge the first portion. The cooling system further includes a first fan operable to recirculate air through the enclosure to absorb heat produced by a plurality of components of the computing device and flow the heated air over the first internal heat exchanger to dissipate the heat.

In one aspect, computing device to be cooled via a liquid. The computing device includes persistent storage, non-persistent storage, and a cooling system. The cooling system includes a first internal heat exchanger positioned within an enclosure of the computing device. The first internal heat exchanger is configured to receive a first portion of the liquid, flow the first portion through the first internal heat exchanger to dissipate heat from air flowing over the first internal heat exchanger, and discharge the first portion. The cooling system further includes a first fan that recirculates air through the enclosure to absorb heat produced by the non-persistent storage and the persistent storage and flow the heated air over the first internal heat exchanger to dissipate the heat.

In one aspect, a method of cooling a computing device. The method includes flowing a first portion of a liquid through a first internal heat exchanger positioned within the computing device and an external heat exchanger positioned external to the computing device to absorb heat from the first internal heat exchanger and dissipate the heat via the external heat exchanger. The method further includes recirculating air within the computing device via a first fan to absorb heat from components of the computing device and dissipate the heat via the first internal heat exchanger.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Figure 1:
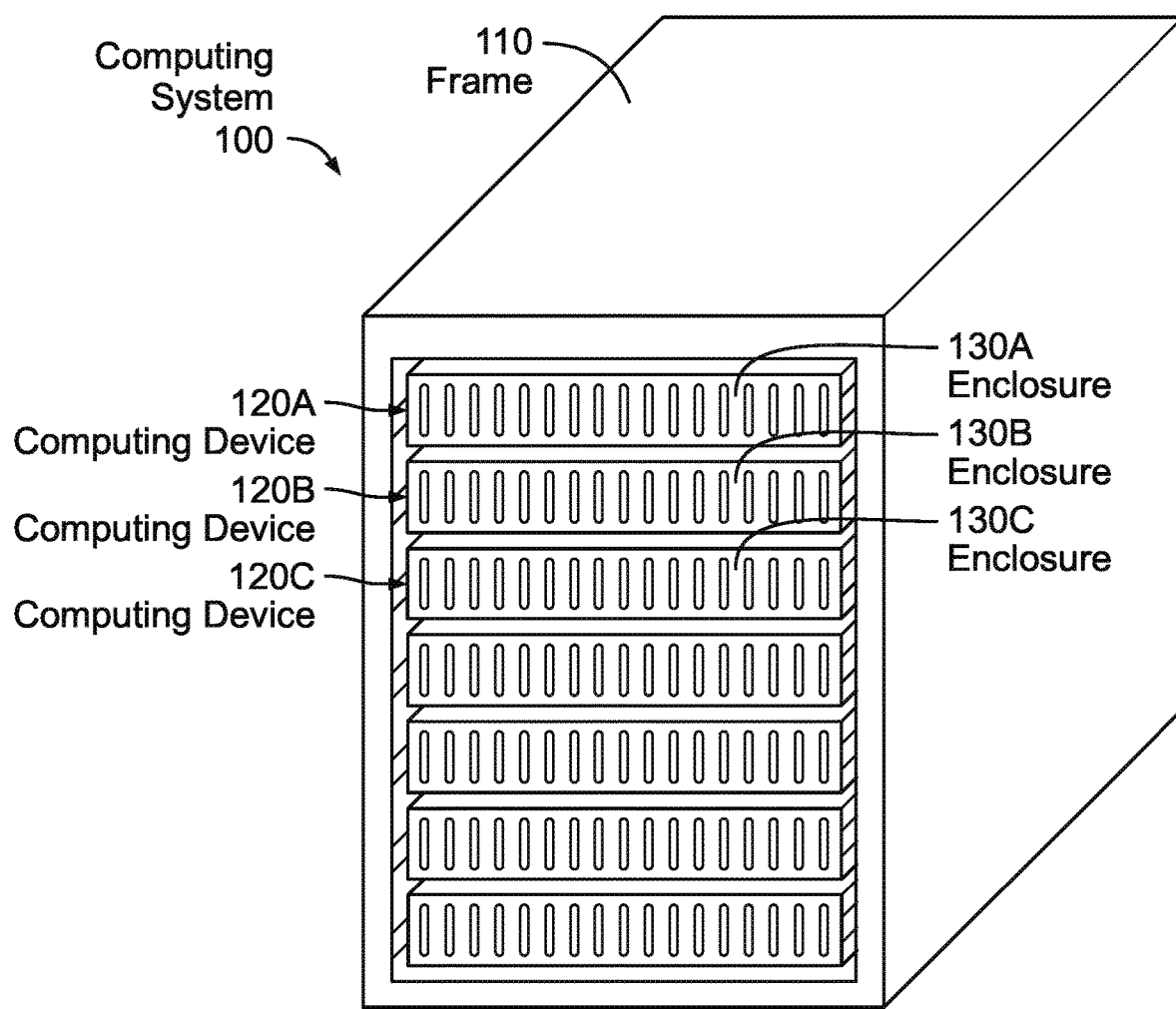
FIG. 1 shows a diagram of a computing device in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for cooling a computing device. The computing device may be a computing device that provides computer-implemented services. These services may include, for example, database services, electronic communication services, data storage services, etc.

The computing devices may include any number of computing components that facilitate providing of the services of the computing device. The computing components may include, for example, processors, non-persistent storage, persistent storage, circuit cards that interconnect these components, etc. When providing the computer-implemented services, various computing components of the computing device generate heat.

Embodiments of the invention may provide methods and systems to cool components of computing devices. To cool the components, the cooling system may lower the temperature of the environment within an enclosure, such as a housing or enclosure of the computing device. For example, the cooling system may circulate air cooled via a heat exchanger through the enclosure to dissipate heat from one or more computing components, thereby cooling the computing components. As a second example, the system may utilize a liquid to dissipate heat from one or more computing components via conduction, thereby cooling the computing components.

By doing so, a computing device cooled via a cooling system in accordance with embodiments of the invention may be less likely to prematurely fail due to overheating and/or be more likely to meet its service life goal.

FIG. 1 shows a computing system (100) in accordance with one or more embodiments of the invention. The system may include a frame (110) and any number of computing devices (e.g., 120A, 120B, 120C).

The frame (110) may be a mechanical structure that enables computing devices (e.g., 120A, 120B, 120C) to be positioned with respect to one another. For example, the frame (110) may be a rack mount that enables computing devices (e.g., 120A, 120B, 120C) to be disposed within it. The frame (110) may be implemented as other types of structures adapted to house, position, orient, and/or otherwise physically, mechanically, electrically, and/or thermally manage computing devices (e.g., 120A, 120B, 120C). By managing the computing devices (e.g., 120A, 120B, 120C), the frame (110) may enable multiple computing device to be densely packed in space without negatively impacting the operation of the computing system (100).

An enclosure (e.g., 130A, 130B, 130C) may be a mechanical structure for components of a computing device (e.g., 120A, 120B, 120C). For example, an enclosure (e.g., 130A, 130B, 130C) may be implemented as a rack mountable enclosure (e.g., 130A, 130B, 130C) for components of a computing device (e.g., 120A, 120B, 120C). The enclosure (e.g., 130A, 130B, 130C) may be adapted to be disposed within the frame (110) and/or utilize services provided by the frame (110) and/or other devices.

Any number of components may be disposed in each of the respective enclosure (e.g., 130A, 130B, 130C). These components may be portions of computing devices (e.g., 120A, 120B, 120C) that provide computer implemented services. To provide services, the computing device (e.g., 120A, 120B, 120C) may utilize computing resources provided by computing components. The computing components may include, for example, processors, non-persistent storage, persistent storage, special purpose hardware, and/or other types of physical components that contribute to the operation of the computing device. For additional details regarding computing devices, refer to FIG. 6.

When the components provide computer-implemented services, the components may generate heat. For example, the components may utilize electrical energy to perform computations and generate heat as a byproduct of performing the computations. If left unchecked, buildup of heat within an enclosure may cause temperatures of the components disposed within the enclosure to exceed preferred ranges.

The preferred ranges may include a nominal range in which the components respectively operate (i) without detriment and/or (ii) are likely to be able to continue to operate through a predetermined service life of a component. Consequently, it may be desirable to maintain the temperatures of the respective components within the preferred range (e.g., a nominal range).

When a component operates outside of the preferred range, the service life of the component may be reduced, the component may not be able to perform optimally (e.g., reduced ability to provide computations, higher likelihood of error introduced into computations, etc.), and/or the component may be more likely to unexpectedly fail. The component may be subject to other undesirable behavior when operating outside of the preferred range without departing from the invention.

Figure 2:
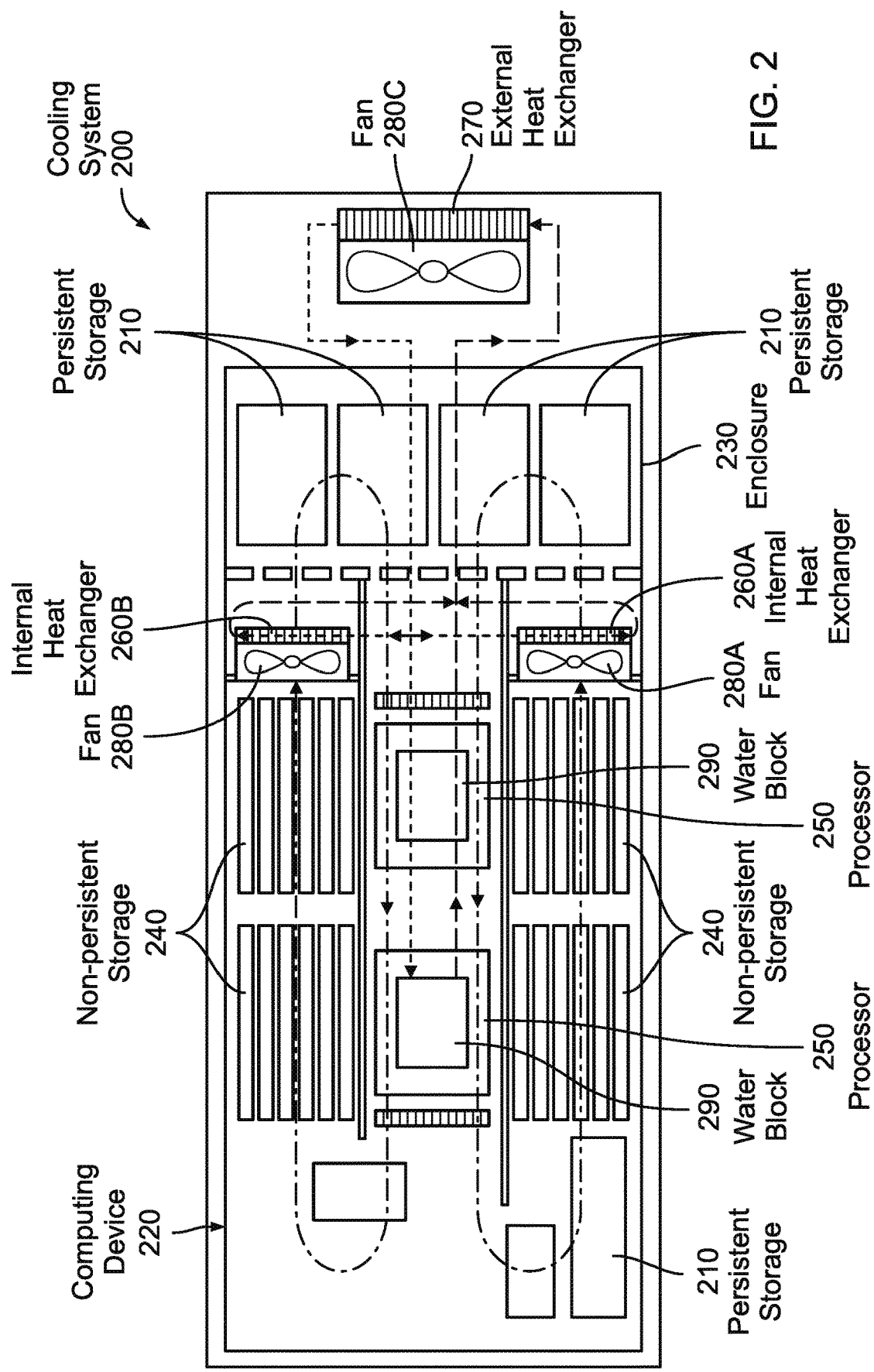
FIG. 2 shows a diagram of a cooling system for a computing device in accordance with one or more embodiments of the invention.

Turning now to FIG. 2, in one embodiment of the invention, a computing device (220) may include a cooling system (200) to operate components, such as, but not limited to, persistent storage (210), non-persistent storage (240), and processors (250), within the preferred range of temperature.

In one embodiment of the invention, the cooling system (200) includes internal heat exchangers (260A, 260B), an external heat exchanger (270), fans (280A, 280B, 280C) coupled to each heat exchanger (e.g., 260A, 260B, 270), and water blocks (290). Example heat exchangers include, but are not limited to, finned tube heat exchangers and microchannel heat exchangers. Further, although two internal heat exchangers (260A, 260B), one external heat exchanger (270), and three fans (280A, 280B, 280C) are shown, any number of internal heat exchangers, external heat exchangers, and fans may be used within the cooling system 200 without departing from the scope of the invention.

To provide cooling to the components of the computing device (220), a liquid, such as, but not limited to, distilled water, glycol, or other liquid coolants, is circulated through the cooling system 200 as shown in FIG. 2. Specifically, the liquid flows into the enclosure (230) and is then divided such that a first portion of the liquid flows into a first internal heat exchanger (260A), a second portion of the liquid flows into a second internal heat exchanger (260B), and a third portion of the liquid flows into the water blocks (290). In one embodiment of the invention, a pump is integrated into one or both of the water blocks (290) to circulate the liquid.

The pumps that circulate the liquid through the cooling system (200) may be controlled locally by the electronic device (220), a control system external to the electronic device (220), or a combination of the electronic device (220) and a control system externa to the electronic device. The operation of each pump may be based on a speed of the pump, a measured flowrate of the liquid through the cooling system (200), a temperature of one or more components (e.g., 210, 240, 250), a temperature of the liquid, a temperature within the enclosure (230) or any combination thereof.

The portions of the liquid flowing through the internal heat exchangers (260A, 260B) absorbs heat from air recirculated within the enclosure (230) via the fans (280A, 280B), thereby cooling the air and heating the liquid. The cooled air is then flowed over the components (e.g., 210, 240, 250) of the computing device (220), cooling the components (e.g., 210, 240, 250) and heating the air. The heated air is then cooled again as the air is recirculated through the internal heat exchangers (260A, 260B). Although FIG. 2 shows the fans (280A, 280B) coupled to the internal heat exchangers (260A, 260B), the invention is not thereby limited. The fans (280A, 280B) may be positioned anywhere within the enclosure (230) that allows the fans (280A, 280B) to recirculate air through the enclosure (230).

The fans (280A, 280B) that recirculate air through the cooling system (200) may be controlled locally by the electronic device (220), a control system external to the electronic device (220), or a combination of the electronic device (220) and a control system externa to the electronic device. The operation of each fan (280A, 280B) may be based on a speed of the fan (280A, 280B), a measured flowrate of the air recirculating through the enclosure (230), a temperature of one or more components (e.g., 210, 240, 250), a temperature of the liquid, a temperature within the enclosure (230) or any combination thereof.

The portion of the liquid flowing through the water blocks (290) absorbs heat from the components (e.g., 250) via cold plate portions of the water blocks that are in thermal communication with the components via a thermal interface material, thereby cooling the components (e.g., 250). Although two water blocks (290) are shown, the invention is not thereby limited. The cooling system (200) may include any number of components (e.g., 210, 240, 250) that are cooled via a water block (290) in thermal communication with the component (e.g., 210, 240, 250).

Once the portions of liquid flowing through the internal heat exchangers (260A, 260B) and the water blocks (290) absorb heat from the components (e.g., 210, 240, 250) and are discharged from the internal heat exchangers (260A, 260B) and water blocks (290), the portions of liquid are recombined within the enclosure (230) and discharged from the enclosure (230). The heated liquid then passes through an external heat exchanger (270) that transfers heat from the liquid to a cooling medium to cool the liquid. In one embodiment of the invention, the cooling medium is air flowed over the external heat exchanger (270) via a fan (280C). In other embodiments, the cooling medium may be a liquid, a gas, or a fluid made up of a combination of liquid and gas. Further, although a single external heat exchanger (270) is shown in FIG. 2, the invention is not thereby limited. Any number of external heat exchangers (270) may be used to remove heat from the liquid circulated through the electronic device (220). Further, the external heat exchanger (270) may include a chiller, an air conditioner, or similar apparatus that cools the cooling medium flowing over the external heat exchanger (270) to a sub-ambient temperature or the external heat exchanger (270) may be in thermal communication with a cold plate cooled by a chiller, an air conditioner, or similar apparatus.

The fan (280C) that flows air over the external heat exchanger (270) may be controlled by the electronic device (220), a control system external to the electronic device (220), or a combination of the electronic device (220) and a control system externa to the electronic device. The operation of each fan (280A, 280B) may be based on a speed of the fan (280A, 280B), a measured flowrate of the air recirculating through the enclosure (230), a temperature of one or more components (e.g., 210, 240, 250), a temperature of the liquid, a temperature within the enclosure (230) or any combination thereof.

Figure 3:
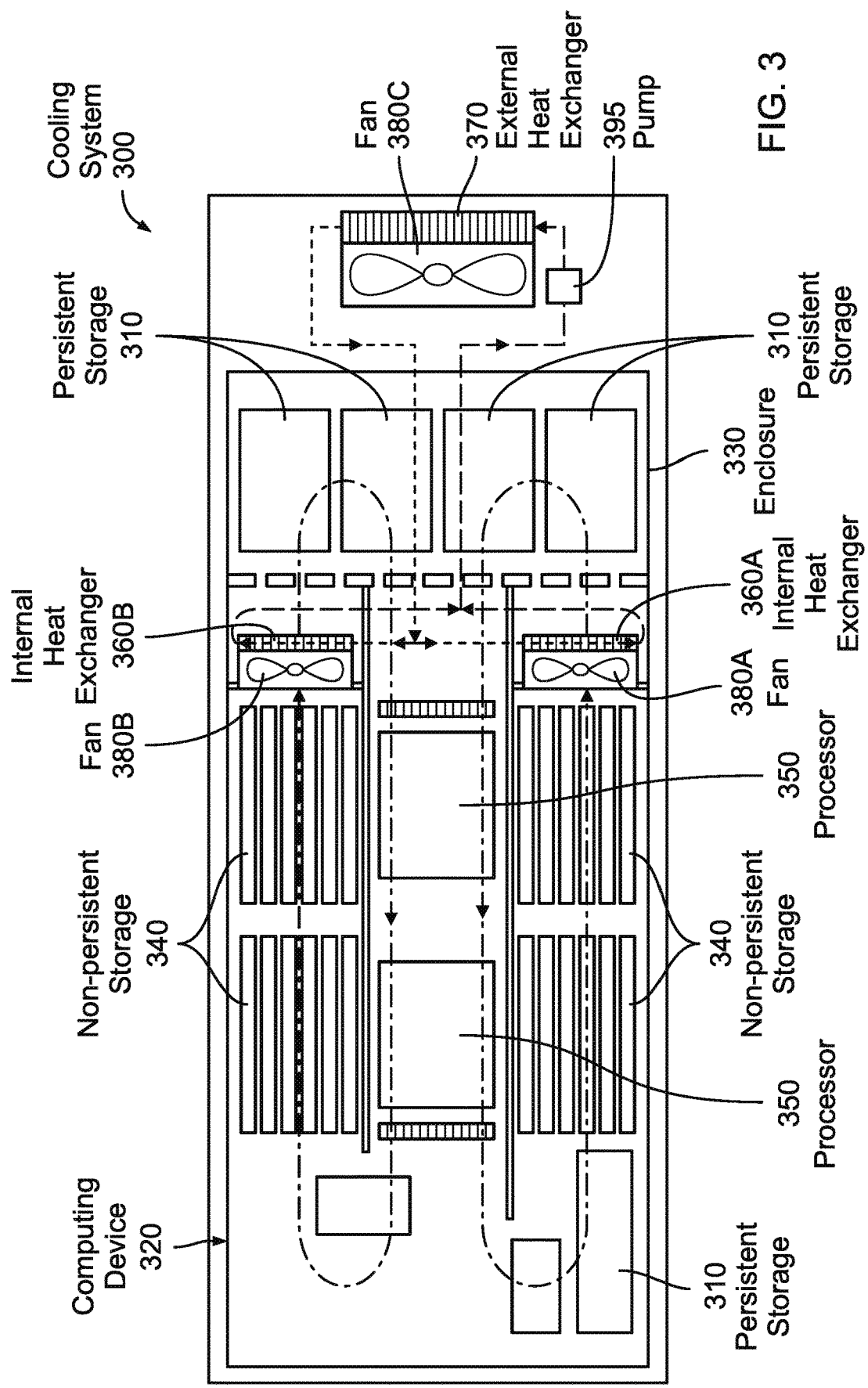
FIG. 3 shows a diagram of a cooling system for a computing device in accordance with one or more embodiments of the invention.

Turning now to FIG. 3, in one embodiment of the invention, a computing device (320) may include a cooling system (300) to operate components, such as, but not limited to, persistent storage (310), non-persistent storage (340), and processors (350) with heatsinks (not shown) in thermal communication with the processors (350), within the preferred range of temperature. In one embodiment of the invention, the cooling system (300) includes internal heat exchangers (360A, 360B), an external heat exchanger (370), fans (380A, 380B, 380C) coupled to each heat exchanger (e.g., 360A, 360B, 370), and a pump (395). Although two internal heat exchangers (360A, 360B), one external heat exchanger (370), and three fans (380A, 380B, 380C) are shown, any number of internal heat exchangers, external heat exchangers, and fans may be used within the cooling system 300 without departing from the scope of the invention.

To provide cooling to the components of the computing device (320), a liquid, such as, but not limited to, distilled water, glycol, or other liquid coolants, is circulated through the cooling system 300 as shown in FIG. 3. Specifically, the liquid flows into the enclosure (330) and is then divided such that a first portion of the liquid flows into a first internal heat exchanger (360A) and a second portion of the liquid flows into a second internal heat exchanger (360B.

The pump (395) that circulate the liquid through the cooling system (300) may be controlled locally by the electronic device (320), a control system external to the electronic device (320), or a combination of the electronic device (320) and a control system externa to the electronic device. The operation of each pump may be based on a speed of the pump, a measured flowrate of the liquid through the cooling system (300), a temperature of one or more components (e.g., 310, 340, 350), a temperature of the liquid, a temperature within the enclosure (330) or any combination thereof. Although only one pump (395) that is external to the enclosure (330) is shown in FIG. 3, the invention is not thereby limited. Any number of pumps (395) may be used and each pump (395) may be positioned within or external to the enclosure (330).

The portions of the liquid flowing through the internal heat exchangers (360A, 360B) absorbs heat from air recirculated within the enclosure (330) via the fans (380A, 380B), thereby cooling the air and heating the liquid. The cooled air is then flowed over the components (e.g., 310, 340, 350) of the computing device (320), cooling the components (e.g., 310, 340, 350) and heating the air. The heated air is then cooled again as the air is recirculated through the internal heat exchangers (360A, 360B). Although FIG. 3 shows the fans (380A, 380B) coupled to the internal heat exchangers (360A, 360B), the invention is not thereby limited. The fans (380A, 380B) may be positioned anywhere within the enclosure (330) that allows the fans (380A, 380B) to recirculate air through the enclosure (330).

The fans (380A, 380B) that recirculate air through the cooling system (300) may be controlled locally by the electronic device (320), a control system external to the electronic device (320), or a combination of the electronic device (320) and a control system externa to the electronic device. The operation of each fan (380A, 380B) may be based on a speed of the fan (380A, 380B), a measured flowrate of the air recirculating through the enclosure (330), a temperature of one or more components (e.g., 310, 340, 350), a temperature of the liquid, a temperature within the enclosure (330) or any combination thereof.

Once the portions of liquid flowing through the internal heat exchangers (360A, 360B) absorb heat from the components (e.g., 310, 340, 350) and are discharged from the internal heat exchangers (360A, 360B), the portions of liquid are recombined within the enclosure (330) and discharged from the enclosure (330). The heated liquid then passes through an external heat exchanger (370) that transfers heat from the liquid to a cooling medium to cool the liquid. In one embodiment of the invention, the cooling medium is air flowed over the external heat exchanger (370) via a fan (380C). In other embodiments, the cooling medium may be a liquid, a gas, or a fluid made up of a combination of liquid and gas. Further, although a single external heat exchanger (370) is shown in FIG. 3, the invention is not thereby limited. Any number of external heat exchangers (370) may be used to remove heat from the liquid circulated through the electronic device (320). Further, the external heat exchanger (370) may include a chiller, an air conditioner, or similar apparatus that cools the cooling medium flowing over the external heat exchanger (370) to a sub-ambient temperature or the external heat exchanger (370) may be in thermal communication with a cold plate cooled by a chiller, an air conditioner, or similar apparatus.

Figure 4:
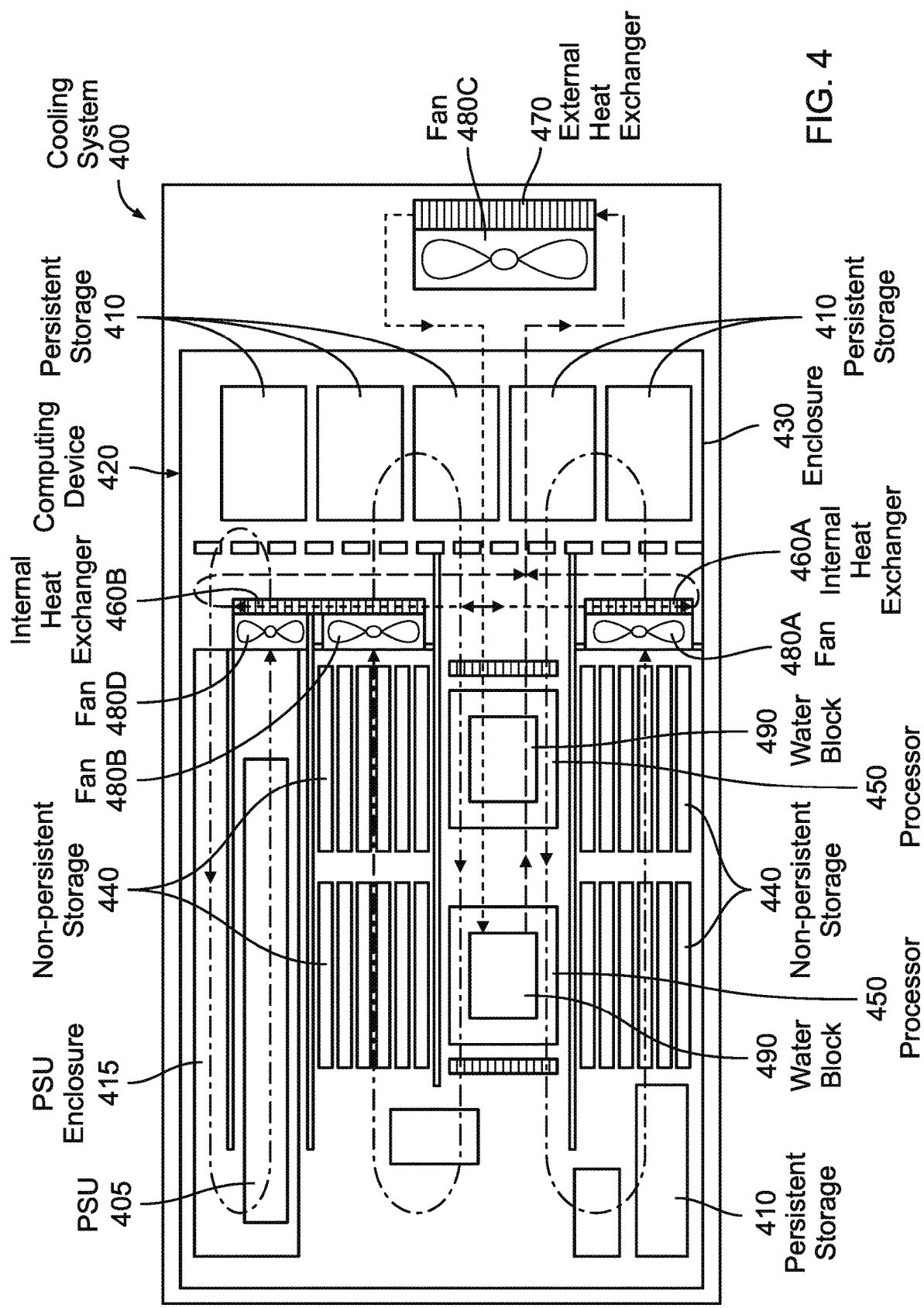
FIG. 4 shows a diagram of a cooling system for a computing device in accordance with one or more embodiments of the invention.

Turning now to FIG. 4, in one embodiment of the invention, a computing device (420) may include a cooling system (400) to operate components, such as, but not limited to, persistent storage (410), non-persistent storage (440), processors (450), and a power supply unit ("PSU") (405) within a PSU enclosure (415) within the preferred range of temperature. In one embodiment of the invention, the cooling system (400) includes internal heat exchangers (460A, 460B), an external heat exchanger (470), fans (480A, 480B, 480C, 480D) coupled to each heat exchanger (e.g., 460A, 460B, 470), and water blocks (490). Although two internal heat exchangers (460A, 460B), one external heat exchanger (470), and four fans (480A, 480B, 480C, 480D) are shown, any number of internal heat exchangers, external heat exchangers, and fans may be used within the cooling system 400 without departing from the scope of the invention.

To provide cooling to the components of the computing device (420), a liquid, such as, but not limited to, distilled water, glycol, or other liquid coolants, is circulated through the cooling system 400 as shown in FIG. 4. Specifically, the liquid flows into the enclosure (430) and is then divided such that a first portion of the liquid flows into a first internal heat exchanger (460A), a second portion of the liquid flows into a second internal heat exchanger (460B), and a third portion of the liquid flows into the water blocks (490). In one embodiment of the invention, a pump is integrated into one or both of the water blocks (490) to circulate the liquid.

The pumps that circulate the liquid through the cooling system (400) may be controlled locally by the electronic device (420), a control system external to the electronic device (420), or a combination of the electronic device (420) and a control system externa to the electronic device. The operation of each pump may be based on a speed of the pump, a measured flowrate of the liquid through the cooling system (400), a temperature of one or more components (e.g., 405, 410, 440, 450), a temperature of the PSU (405), a temperature of the liquid, a temperature within the enclosure (430) or any combination thereof.

The portions of the liquid flowing through the internal heat exchangers (460A, 460B) absorbs heat from air recirculated within the enclosure (430) via the fans (480A, 480B), thereby cooling the air and heating the liquid. The cooled air is then flowed over the components (e.g., 410, 440, 450) of the computing device (420), cooling the components (e.g., 410, 440, 450) and heating the air. The heated air is then cooled again as the air is recirculated through the internal heat exchangers (460A, 460B). Although FIG. 4 shows the fans (480A, 480B) coupled to the internal heat exchangers (460A, 460B), the invention is not thereby limited. The fans (480A, 480B) may be positioned anywhere within the enclosure (430) that allows the fans (480A, 480B) to recirculate air through the enclosure (430).

The portion of the liquid flowing through the internal heat exchanger (460B) proximate the PSU also absorbs heat from air recirculated within the PSU enclosure (415) via a fan (480D) thereby cooling the air and heating the liquid. The cooled air is then flowed over the PSU (405), cooling the PSU (405) and heating the air. The heated air is then cooled again as the air is recirculated through the internal heat exchanger (460B). Although FIG. 4 shows the fan (480D) coupled to the internal heat exchanger (460B), the invention is not thereby limited. The fan (480D) may be positioned anywhere within the PSU enclosure (415) that allows the fan (480D) to recirculate air through the PSU enclosure (415).

The fans (480A, 280B, 480D) that recirculate air through the cooling system (400) may be controlled locally by the electronic device (420), a control system external to the electronic device (420), or a combination of the electronic device (420) and a control system externa to the electronic device. The operation of each fan (480A, 480B, 480D) may be based on a speed of the fan (480A, 480B), a measured flowrate of the air recirculating through the enclosure (430), a temperature of one or more components (e.g., 410, 440, 450), a temperature of the PSU (405), a temperature of the liquid, a temperature within the enclosure (430) or any combination thereof.

The portion of the liquid flowing through the water blocks (490) absorbs heat from the components (e.g., 450) via cold plate portions of the water blocks that are in thermal communication with the components via a thermal interface material, thereby cooling the components (e.g., 450). Although two water blocks (490) are shown, the invention is not thereby limited. The cooling system (400) may include any number of components (e.g., 410, 440, 450) that are cooled via a water block (490) in thermal communication with the component (e.g., 410, 440, 450).

Once the portions of liquid flowing through the internal heat exchangers (460A, 460B) and the water blocks (490) absorb heat from the components (e.g., 410, 440, 450) and the PSU (405) and are discharged from the internal heat exchangers (460A, 460B) and water blocks (490), the portions of liquid are recombined within the enclosure (430) and discharged from the enclosure (430). The heated liquid then passes through an external heat exchanger (470) that transfers heat from the liquid to a cooling medium to cool the liquid. In one embodiment of the invention, the cooling medium is air flowed over the external heat exchanger (470) via a fan (480C). In other embodiments, the cooling medium may be a liquid, a gas, or a fluid made up of a combination of liquid and gas. Further, although a single external heat exchanger (470) is shown in FIG. 4, the invention is not thereby limited. Any number of external heat exchangers (470) may be used to remove heat from the liquid circulated through the electronic device (420). Further, the external heat exchanger (470) may include a chiller, an air conditioner, or similar apparatus that cools the cooling medium flowing over the external heat exchanger (470) to a sub-ambient temperature or the external heat exchanger (470) may be in thermal communication with a cold plate cooled by a chiller, an air conditioner, or similar apparatus.

The fan (480C) that flows air over the external heat exchanger (470) may be controlled by the electronic device (420), a control system external to the electronic device (420), or a combination of the electronic device (420) and a control system externa to the electronic device. The operation of each fan (480A, 480B) may be based on a speed of the fan (480A, 480B), a measured flowrate of the air recirculating through the enclosure (430), a temperature of one or more components (e.g., 410, 440, 450), a temperature of the PSU (405), a temperature of the liquid, a temperature within the enclosure (430) or any combination thereof.

Figure 5:
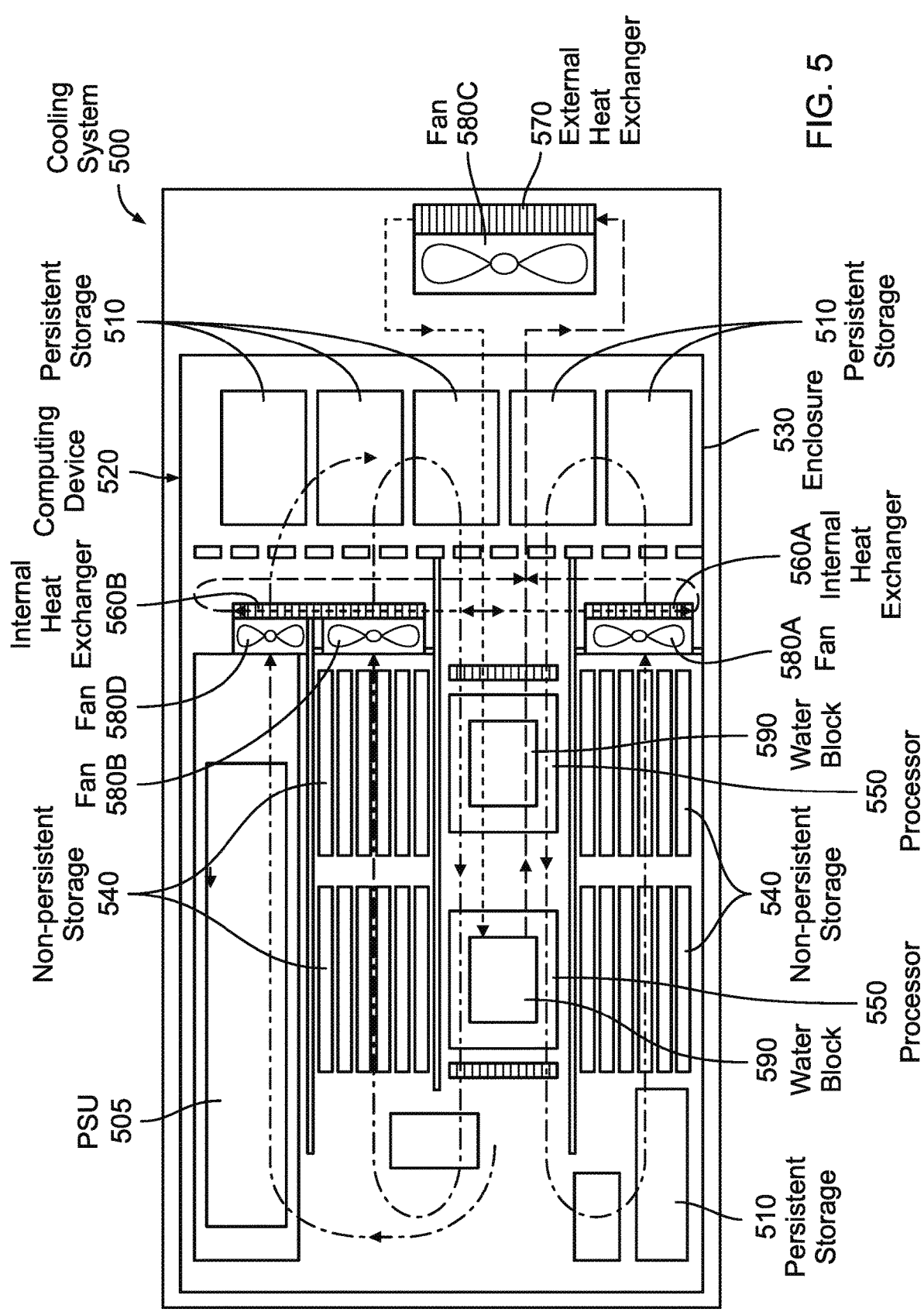
FIG. 5 shows a diagram of a cooling system for a computing device in accordance with one or more embodiments of the invention.

Turning now to FIG. 5, in one embodiment of the invention, a computing device (520) may include a cooling system (500) to operate components, such as, but not limited to, persistent storage (510), non-persistent storage (540), processors (550), and a PSU (505) within the preferred range of temperature. In one embodiment of the invention, the cooling system (500) includes internal heat exchangers (560A, 560B), an external heat exchanger (570), fans (580A, 580B, 580C) coupled to each heat exchanger (e.g., 560A, 560B, 570), and water blocks (590). Although two internal heat exchangers (560A, 560B), one external heat exchanger (570), and three fans (580A, 580B, 580C) are shown, any number of internal heat exchangers, external heat exchangers, and fans may be used within the cooling system 500 without departing from the scope of the invention.

To provide cooling to the components of the computing device (520), a liquid, such as, but not limited to, distilled water, glycol, or other liquid coolants, is circulated through the cooling system 500 as shown in FIG. 5. Specifically, the liquid flows into the enclosure (530) and is then divided such that a first portion of the liquid flows into a first internal heat exchanger (560A), a second portion of the liquid flows into a second internal heat exchanger (560B), and a third portion of the liquid flows into the water blocks (590). In one embodiment of the invention, a pump is integrated into one or both of the water blocks (590) to circulate the liquid.

The pumps that circulate the liquid through the cooling system (500) may be controlled locally by the electronic device (520), a control system external to the electronic device (520), or a combination of the electronic device (520) and a control system externa to the electronic device. The operation of each pump may be based on a speed of the pump, a measured flowrate of the liquid through the cooling system (500), a temperature of one or more components (e.g., 510, 540, 550), a temperature of the PSU (505), a temperature of the liquid, a temperature within the enclosure (530) or any combination thereof.

The portions of the liquid flowing through the internal heat exchangers (560A, 560B) absorbs heat from air recirculated within the enclosure (530) via the fans (580A, 580B), thereby cooling the air and heating the liquid. The cooled air is then flowed over the components (e.g., 510, 540, 550) and the PSU (505) of the computing device (520), cooling the components (e.g., 510, 540, 550) and the PSU (505) and heating the air. The heated air is then cooled again as the air is recirculated through the internal heat exchangers (560A, 560B). Although FIG. 5 shows the fans (580A, 580B) coupled to the internal heat exchangers (560A, 560B), the invention is not thereby limited. The fans (580A, 580B) may be positioned anywhere within the enclosure (530) that allows the fans (580A, 580B) to recirculate air through the enclosure (530).

The fans (580A, 580B) that recirculate air through the cooling system (500) may be controlled locally by the electronic device (520), a control system external to the electronic device (520), or a combination of the electronic device (520) and a control system externa to the electronic device. The operation of each fan (580A, 580B) may be based on a speed of the fan (580A, 580B), a measured flowrate of the air recirculating through the enclosure (530), a temperature of one or more components (e.g., 510, 540, 550), a temperature of the PSU (505), a temperature of the liquid, a temperature within the enclosure (530) or any combination thereof.

The portion of the liquid flowing through the water blocks (590) absorbs heat from the components (e.g., 550) via cold plate portions of the water blocks that are in thermal communication with the components via a thermal interface material, thereby cooling the components (e.g., 550). Although two water blocks (590) are shown, the invention is not thereby limited. The cooling system (500) may include any number of components (e.g., 510, 540, 550) that are cooled via a water block (590) in thermal communication with the component (e.g., 510, 540, 550).

Once the portions of liquid flowing through the internal heat exchangers (560A, 560B) and the water blocks (590) absorb heat from the components (e.g., 510, 540, 550) and are discharged from the internal heat exchangers (560A, 560B) and water blocks (590), the portions of liquid are recombined within the enclosure (530) and discharged from the enclosure (530). The heated liquid then passes through an external heat exchanger (570) that transfers heat from the liquid to a cooling medium to cool the liquid. In one embodiment of the invention, the cooling medium is air flowed over the external heat exchanger (570) via a fan (580C). In other embodiments, the cooling medium may be a liquid, a gas, or a fluid made up of a combination of liquid and gas. Further, although a single external heat exchanger (570) is shown in FIG. 5, the invention is not thereby limited. Any number of external heat exchangers (570) may be used to remove heat from the liquid circulated through the electronic device (520). Further, the external heat exchanger (570) may include a chiller, an air conditioner, or similar apparatus that cools the cooling medium flowing over the external heat exchanger (570) to a sub-ambient temperature or the external heat exchanger (570) may be in thermal communication with a cold plate cooled by a chiller, an air conditioner, or similar apparatus.

The fan (580C) that flows air over the external heat exchanger (570) may be controlled by the electronic device (520), a control system external to the electronic device (520), or a combination of the electronic device (520) and a control system externa to the electronic device. The operation of each fan (580A, 580B) may be based on a speed of the fan (580A, 580B), a measured flowrate of the air recirculating through the enclosure (530), a temperature of one or more components (e.g., 510, 540, 550), a temperature of the PSU (505), a temperature of the liquid, a temperature within the enclosure (530) or any combination thereof.

Figure 6:
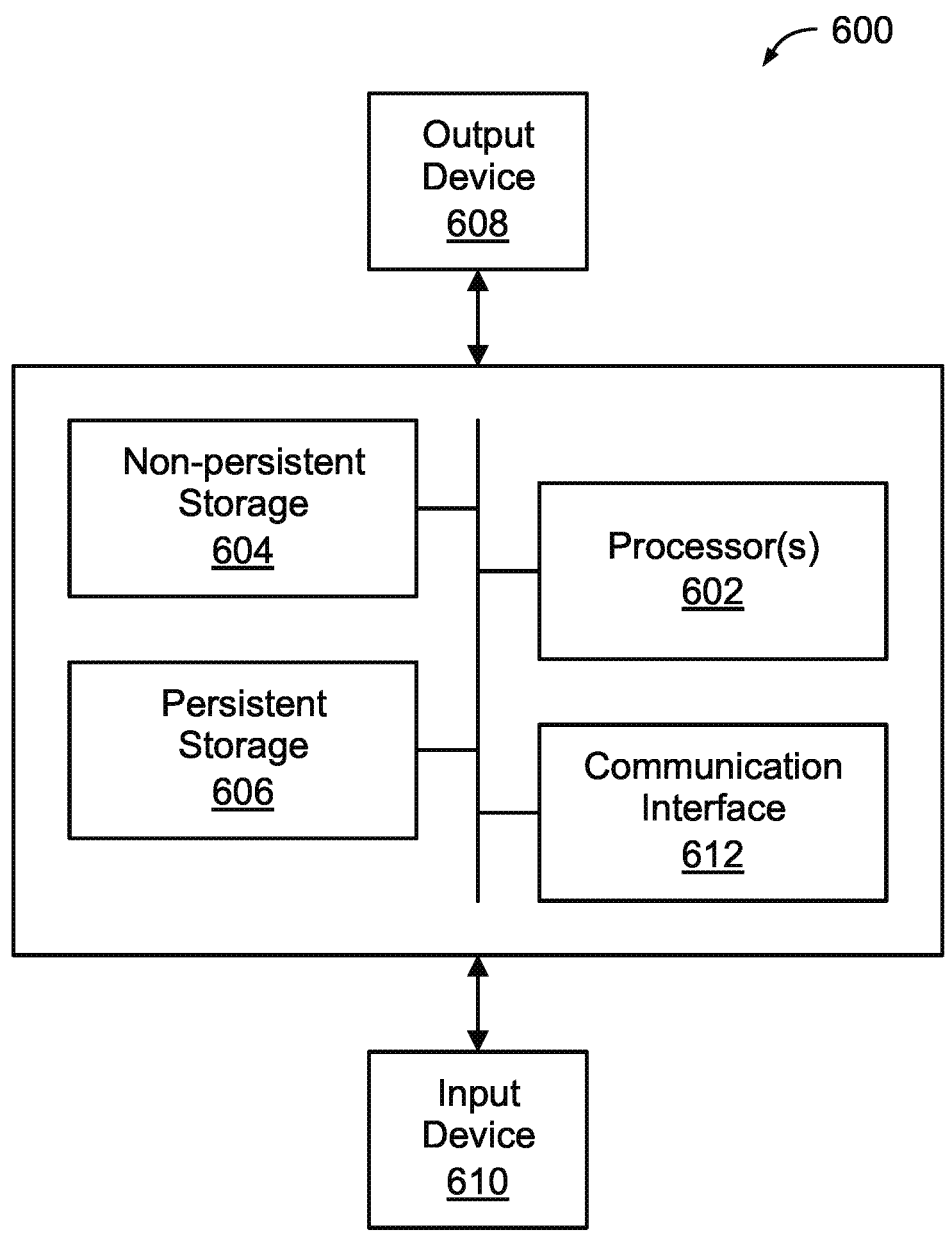
FIG. 6 shows a diagram of a computing device in accordance with one or more embodiments of the invention.

Additionally, as discussed above, embodiments of the invention may be implemented to cool a computing device. FIG. 6 shows a diagram of a computing device in accordance with one or more embodiments of the invention. The computing device (600) may include one or more computer processors (602), non-persistent storage (604) (e.g., volatile memory, such as random access memory (RAM), cache memory), persistent storage (606) (e.g., a hard disk, an optical drive such as a compact disk (CD) drive or digital versatile disk (DVD) drive, a flash memory, etc.), a communication interface (612) (e.g., Bluetooth interface, infrared interface, network interface, optical interface, etc.), input devices (610), output devices (608), and numerous other elements (not shown) and functionalities. Each of these components is described below.

In one embodiment of the invention, the computer processor(s) (602) may be an integrated circuit for processing instructions. For example, the computer processor(s) may be one or more cores or micro-cores of a processor. The computing device (600) may also include one or more input devices (610), such as a touchscreen, keyboard, mouse, microphone, touchpad, electronic pen, or any other type of input device. Further, the communication interface (612) may include an integrated circuit for connecting the computing device (600) to a network (not shown) (e.g., a local area network (LAN), a wide area network (WAN) such as the Internet, mobile network, or any other type of network) and/or to another device, such as another computing device.

In one embodiment of the invention, the computing device (600) may include one or more output devices (608), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (602), non-persistent storage (604), and persistent storage (606). Many different types of computing devices exist, and the aforementioned input and output device(s) may take other forms.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A cooling system for use with a liquid to cool a computing device, the cooling system comprising:
   a first internal heat exchanger positioned within an enclosure of the computing device, the first internal heat exchanger configured to receive a first portion of the liquid, flow the first portion through the first internal heat exchanger to dissipate heat from air flowing over the first internal heat exchanger, and discharge the first portion of the liquid;
   a first fan operable to recirculate the air through the enclosure to absorb heat produced by a plurality of components of the computing device and flow heated air over the first internal heat exchanger to dissipate the heat;
   a water block comprising a cold plate positionable in thermal communication with a component of the plurality of components via a thermal interface material, the water block configured to receive a second portion of the liquid, flow the second portion over the cold plate, and discharge the second portion of the liquid to dissipate heat from the component of the computing device, wherein the liquid is divided into portions of the liquid comprising the first portion of the liquid and the second portion of the liquid prior to the first portion of the liquid flowing through the first internal heat exchanger and prior to the second portion of the liquid flowing through the water block; and
   an external heat exchanger positionable external to the computing device, wherein:
      the water block further comprises a pump operable to circulate at least the second portion of the liquid through the water block and the external heat exchanger, and
      the second portion of the liquid is recombined with the first portion of the liquid after the first portion of the liquid is discharged from the first internal heat exchanger, after the second portion of the liquid is discharged from the water block, and prior to flowing through the external heat exchanger.

2. The cooling system of claim 1, wherein the component is an integrated circuit.

3. The cooling system of claim 1, further comprising:
   a second internal heat exchanger positioned within the enclosure of the computing device, the second internal heat exchanger configured to receive a third portion of the liquid, flow the third portion of the liquid through the second internal heat exchanger to dissipate heat from the air flowing over the second internal heat exchanger, and discharge the third portion of the liquid.

4. The cooling system of claim 3, further comprising:
   a second fan operable to recirculate the air within a power supply unit ("PSU") of the computing device to absorb heat from components of the PSU and flow the heated air over the second internal heat exchanger to dissipate the heat.

5. The cooling system of claim 3, further comprising:
   a second fan operable to recirculate the air through the enclosure to absorb heat produced by the plurality of components of the computing device and flow the heated air over the second internal heat exchanger to dissipate the heat.

6. The cooling system of claim 3, further comprising:
   a second fan and a third fan, the second fan and third fan both operable to recirculate the air through the enclosure to absorb heat produced by a PSU of the computing device and the plurality of components of the computing device and flow the heated air over the second internal heat exchanger to dissipate the heat.

7. A computing device to be cooled via a liquid, the computing device comprising:
   non-persistent storage;
   persistent storage; and
   a cooling system comprising:
      a first internal heat exchanger positioned within an enclosure of the computing device, the first internal heat exchanger configured to receive a first portion of the liquid, flow the first portion through the first internal heat exchanger to dissipate heat from air flowing over the first internal heat exchanger, and discharge the first portion of the liquid;
      a first fan that recirculates the air through the enclosure to absorb heat produced by the non-persistent storage and the persistent storage and flow heated air over the first internal heat exchanger to dissipate the heat; and
      a water block comprising a cold plate positionable in thermal communication with a component of the computing device via a thermal interface material, the water block configured to receive a second portion of the liquid, flow the second portion over the cold plate, and discharge the second portion of the liquid to dissipate heat from the component of the computing device, wherein the liquid is divided into portions of the liquid comprising the first portion of the liquid and the second portion of the liquid prior to the first portion of the liquid flowing through the first internal heat exchanger and prior to the second portion of the liquid flowing through the water block; and
      an external heat exchanger positionable external to the computing device, wherein:
         the water block further comprises a pump operable to circulate at least the second portion of the liquid through the water block and the external heat exchanger, and
         the second portion of the liquid is recombined with the first portion of the liquid after the first portion of the liquid is discharged from the first internal heat exchanger, after the second portion of the liquid is discharged from the water block, and prior to flowing through the external heat exchanger.

8. The computing device of claim 7, further comprising:
   an integrated circuit, wherein the component comprises the integrated circuit.

9. The computing device of claim 7, further comprising:
   an integrated circuit, wherein heat produced by the integrated circuit is dissipated via the air recirculated by the first fan.

10. The computing device of claim 7, wherein the cooling system further comprises:
- a second internal heat exchanger positioned within an enclosure of the computing device, the second internal heat exchanger configured to receive a third portion of the liquid, flow the third portion of the liquid through the second internal heat exchanger to dissipate heat from the air flowing over the second internal heat exchanger, and discharge the third portion of the liquid.

11. The computing device of claim 10, further comprising:
- a PSU; and
- wherein the cooling system further comprises:
  - a second fan that recirculates the air within the PSU to absorb heat from components of the PSU and flow the heated air over the second internal heat exchanger to dissipate the heat.

12. The computing device of claim 10, wherein the cooling system further comprises:
- a second fan that recirculates the air through the enclosure to absorb heat produced by the non-persistent storage and the persistent storage and flow the heated air over the second internal heat exchanger to dissipate the heat.

13. The computing device of claim 10, further comprising:
- a PSU; and
- wherein the cooling system further comprises:
  - a second fan and a third fan that both recirculate the air through the enclosure to absorb heat produced by the PSU, the non-persistent storage, and the persistent storage and flow the heated air over the second internal heat exchanger to dissipate the heat.

14. The computing device of claim 7, wherein the computing device is mountable in a rack.

15. A method of cooling a computing device, the method comprising:
- flowing a first portion of a liquid through a first internal heat exchanger positioned within the computing device to absorb heat from the first internal heat exchanger;
- recirculating air within the computing device via a first fan to absorb heat from components of the computing device and dissipate the heat via the first internal heat exchanger;
- flowing a second portion of the liquid through a water block comprising a cold plate positionable in thermal communication with a component of the computing device via a thermal interface material, the water block configured to receive the second portion of the liquid, flow the second portion over the cold plate, and discharge the second portion of the liquid to dissipate heat from the component of the computing device, wherein the liquid is divided into portions of the liquid comprising the first portion of the liquid and the second portion of the liquid prior to the first portion of the liquid flowing through the first internal heat exchanger and prior to the second portion of the liquid flowing through the water block; and
- flowing the second portion of the liquid through an external heat exchanger positionable external to the computing device wherein the second portion of the liquid is recombined with the first portion of the liquid after the first portion of the liquid is discharged from the first internal heat exchanger, after the second portion of the liquid is discharged from the water block, and prior to flowing through the external heat exchanger.

16. The method of claim 15, further comprising:
- flowing a third portion of the liquid through a second internal heat exchanger positioned within the computing device and the external heat exchanger to absorb heat from the second internal heat exchanger and dissipate the heat via the external heat exchanger; and
- recirculating the air within a PSU of the computing device via a second fan to absorb heat from components of the PSU and dissipate the heat via the second internal heat exchanger.

17. The method of claim 15, wherein the component comprises an integrated circuit.

* * * * *